(12) United States Patent
Kwon et al.

(10) Patent No.: US 8,519,395 B2
(45) Date of Patent: Aug. 27, 2013

(54) DISPLAY DEVICE AND METHOD FOR MANUFACTURING THE SAME

(75) Inventors: Min-Sung Kwon, Yongin (KR); Joo-Sun Yoon, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 247 days.

(21) Appl. No.: 13/094,685

(22) Filed: Apr. 26, 2011

(65) Prior Publication Data
US 2012/0097940 A1    Apr. 26, 2012

(30) Foreign Application Priority Data
Oct. 22, 2010 (KR) .................. 10-2010-0103494

(51) Int. Cl.
*H01L 33/00* (2010.01)
(52) U.S. Cl.
USPC ............... 257/59; 257/72; 257/88; 257/210; 257/211; 257/E33.064; 438/28
(58) Field of Classification Search
USPC .............. 257/59, 72, 88, 210, 211, E33.064; 438/28
See application file for complete search history.

(56) References Cited

U.S. PATENT DOCUMENTS

| | | | |
|---|---|---|---|
| 2006/0145161 A1* | 7/2006 | Lee et al. | 257/72 |
| 2007/0262347 A1* | 11/2007 | You | 257/202 |
| 2009/0091676 A1* | 4/2009 | Takeuchi et al. | 349/43 |
| 2009/0261334 A1* | 10/2009 | Ahn | 257/59 |
| 2010/0163862 A1* | 7/2010 | Yang et al. | 257/43 |
| 2011/0012123 A1* | 1/2011 | Seong et al. | 257/59 |
| 2011/0297931 A1* | 12/2011 | Yang et al. | 257/43 |

FOREIGN PATENT DOCUMENTS

| | | |
|---|---|---|
| KR | 10-2008-0109998 A | 12/2008 |
| KR | 10-2010-0025837 A | 3/2010 |

OTHER PUBLICATIONS

Mutsumi Kimura, et al. "Trap densities in amorphous-InGaZnO$_4$ thin-film transistors," Applied Physics Letters, vol. 92, 133512 pp. 1-3, (2008).

\* cited by examiner

*Primary Examiner* — Victor A Mandala
(74) *Attorney, Agent, or Firm* — Christie, Parker & Hale, LLP

(57) ABSTRACT

A display device according to an exemplary embodiment includes: gate wires, at least one of the gate wires having a first multi-layered structure including a first transparent conductive layer formed on the substrate and a first metal layer formed on the first transparent conductive layer and at least another one of the gate wires having a first single-layered structure formed with the first transparent conductive layer; a semiconductor layer formed on a part of the gate wires; and data wires with at least one of the data wires having a second multi-layered structure including a second transparent conductive layer formed on the semiconductor layer and a second metal layer formed on the second transparent conductive layer and at least another one of the data wires having a second single-layered structure formed with the second transparent conductive layer.

30 Claims, 8 Drawing Sheets

DISPLAY DEVICE AND METHOD FOR MANUFACTURING THE SAME

CROSS-REFERENCE TO RELATED APPLICATION

This application claims priority to and the benefit of Korean Patent Application No. 10-2010-0103494, filed in the Korean Intellectual Property Office on Oct. 22, 2010, the entire content of which is incorporated herein by reference.

BACKGROUND

1. Field

An exemplary embodiment of the described technology relates to a display device and a manufacturing method thereof. More particularly, the described technology relates to a display device of which its aperture ratio is improved while simplifying its structure and a manufacturing method thereof.

2. Description of Related Art

Most flat panel display devices, such as an organic light emitting diode (OLED) display, a liquid crystal display (LCD), and the like, include a thin film transistor and a capacitor.

The thin film transistor includes an ohmic contact layer formed to reduce contact resistance between a semiconductor layer, a source electrode, and a drain electrode. The ohmic contact layer was usually formed by doping impurities on the semiconductor layer. A process for forming the ohmic contact layer becomes a limit in simplification of the entire manufacturing process of the display device.

In addition, since the capacitor typically includes at least one metallic electrode, it is not easy to increase the aperture ratio of the display device.

The above information disclosed in this Background section is only for enhancement of understanding of the background of the described technology and therefore it may contain information that does not form the prior art that is already known in this country to a person of ordinary skill in the art.

SUMMARY

Aspects of embodiments of the present invention are directed toward a display device of which its structure and its manufacturing process are simplified while improving its aperture ratio.

A display device according to an exemplary embodiment includes: a substrate; a plurality of gate wires, at least one of the gate wires having a first multi-layered structure including a first transparent conductive layer formed on the substrate and a first metal layer formed on the first transparent conductive layer and at least another one of the gate wires having a first single-layered structure formed with the first transparent conductive layer; a semiconductor layer formed on a part of the gate wires; and a plurality of data wires, at least one of the data wires having a second multi-layered structure including a second transparent conductive layer formed on the semiconductor layer and a second metal layer formed on the second transparent conductive layer and at least another one of the data wires having a second single-layered structure formed with the second transparent conductive layer.

In one embodiment, the gate wires include a gate electrode, a first capacitor electrode, and a capacitor line, and the semiconductor layer is at least partially formed on the gate electrode.

In one embodiment, the gate electrode is formed to have the first multi-layer structure including the first transparent conductive layer and the first metal layer, and the first capacitor electrode and the capacitor line are each formed with the first transparent conductive layer.

In one embodiment, the gate electrode and the capacitor line are each formed to have the first multi-layer structure including the first transparent conductive layer and the first metal layer, and the first capacitor electrode is formed with the first transparent conductive layer.

In one embodiment, the data wires include a source electrode, a drain electrode, and a second capacitor electrode, the source electrode and the drain electrode respectively contact the semiconductor layer, and the second capacitor electrode at least partially overlaps the first capacitor electrode.

In one embodiment, the source electrode and the drain electrode are each formed to have the second multi-layer structure including the second transparent conductive layer and the second metal layer, and the second capacitor electrode is formed with the second transparent conductive layer.

In one embodiment, the second capacitor electrode extends from the second transparent conductive layer of the drain electrode.

In one embodiment, the source electrode and the drain electrode are each at least partially formed on the semiconductor layer, and the second transparent conductive layer of the source electrode and the second transparent conductive layer of the drain electrode become ohmic contact layers between the semiconductor layer and the second metal layer of the source electrode, and between the semiconductor layer and the second metal layer of the drain electrode.

In one embodiment, the display device further includes an interlayer insulating layer covering the data wires, and the interlayer insulating layer has a pixel contact hole partially exposing the second capacitor electrode.

In one embodiment, the display device further includes a pixel electrode formed on the interlayer insulating layer, and the pixel electrode contacts the second capacitor electrode through the pixel contact hole.

In one embodiment, the pixel contact hole is formed on the capacitor line.

In one embodiment, the interlayer insulating layer includes an organic material.

In one embodiment, the semiconductor layer is an oxide semiconductor.

In one embodiment, the semiconductor layer includes oxygen (O) and at least one of gallium (Ga), indium (In), zinc (Zn), hafnium (Hf), and tin (Sn).

In one embodiment, the display device further includes an etching prevention film disposed between the semiconductor layer and the data wires, the etching prevention film has a source contact hole and a drain contact hole respectively exposing a part of the semiconductor layer, and the source electrode and the drain electrode respectively contact the semiconductor layer through the source contact hole and the drain contact hole.

In one embodiment, the source electrode and the drain electrode are separated from each other on the semiconductor layer, and the display device further includes an etching prevention film disposed between the semiconductor layer and an area where the semiconductor layer, the source electrode, and the drain electrode are separated from each other.

A manufacturing method of a display device according to another exemplary embodiment includes: preparing a substrate; sequentially stacking a first transparent conductive layer and a first metal layer on the substrate and then forming gate wires including a gate electrode, a first capacitor electrode, and a capacitor line by patterning the sequentially stacked first transparent conductive and first metal layers; forming a gate insulating layer covering the gate wires; forming a semiconductor layer at least partially overlapped with the gate electrode on the gate insulating layer; and sequentially stacking a second transparent conductive layer and a second metal layer on the semiconductor layer and the gate insulating layer and then forming data wires including a source electrode contacting the semiconductor layer, a drain electrode contacting the semiconductor layer, and a second capacitor electrode at least partially overlapped with the first capacitor electrode by patterning the sequentially stacked second transparent conductive and second metal layers.

In one embodiment, the gate electrode is formed to have a multi-layer structure including the first transparent conductive layer and the first metal layer, the first capacitor electrode and the capacitor line are each formed with the first transparent conductive layer, and the gate electrode, the first capacitor electrode, and the capacitor line are formed together through a photolithography process using one mask.

In one embodiment, the gate electrode and the capacitor line are each formed to have a multi-layer structure including the first transparent conductive layer and the first metal layer, the first capacitor electrode is formed with the first transparent conductive layer, and the gate electrode, the capacitor line, and the first capacitor electrode are formed together through a photolithography process using one mask.

In one embodiment, the source electrode and the drain electrode are each formed to have a multi-layer including the second transparent conductive layer and the second metal layer, the second capacitor electrode is formed with the second transparent conductive layer, and the source electrode, the drain electrode, and the second capacitor electrode are formed together through a photolithography process using one mask.

In one embodiment, the second capacitor electrode extends from the second transparent conductive layer of the drain electrode.

In one embodiment, the source electrode and the drain electrode are partially formed on the semiconductor layer, and the second transparent conductive layer of the source electrode and the second transparent conductive layer of the drain electrode become ohmic contact layers between the semiconductor layer and the second metal layer of the source electrode, and between the semiconductor layer and the second metal layer of the drain electrode.

In one embodiment, the manufacturing method further includes forming an interlayer insulating layer covering the data wires, and the interlayer insulating layer has a pixel contact hole partially exposing the second capacitor electrode.

In one embodiment, the manufacturing method further includes forming a pixel electrode on the interlayer insulating layer, and the pixel electrode contacts the second capacitor electrode through the pixel contact hole.

In one embodiment, the pixel contact hole is formed on the capacitor line.

In one embodiment, the interlayer insulating layer includes an organic material.

In one embodiment, the semiconductor layer is an oxide semiconductor layer.

In one embodiment, the semiconductor layer includes oxygen (O) and at least one of gallium (Ga), indium (In), zinc (Zn), hafnium (Hf), and tin (Sn).

In one embodiment, the manufacturing method further includes forming an etching prevention film between the semiconductor layer and the data wires, the etching prevention film has a source contact hole and a drain contact hole respectively exposing the semiconductor layer, and the source electrode and the drain electrode respectively contact the semiconductor layer through the source contact hole and the drain contact hole.

In one embodiment, the source electrode and the drain electrode are separated from each other on the semiconductor layer, and the manufacturing method further includes forming an etching prevention film between the semiconductor layer and an area where the semiconductor layer, the source electrode, and the drain electrode are separated from each other.

According to the exemplary embodiments, the display device can have a simple structure while simultaneously improving its aperture ratio.

In addition, the steps of the entire manufacturing process of the display device can be reduced.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION OF THE EMBODIMENTS

Figure 1:
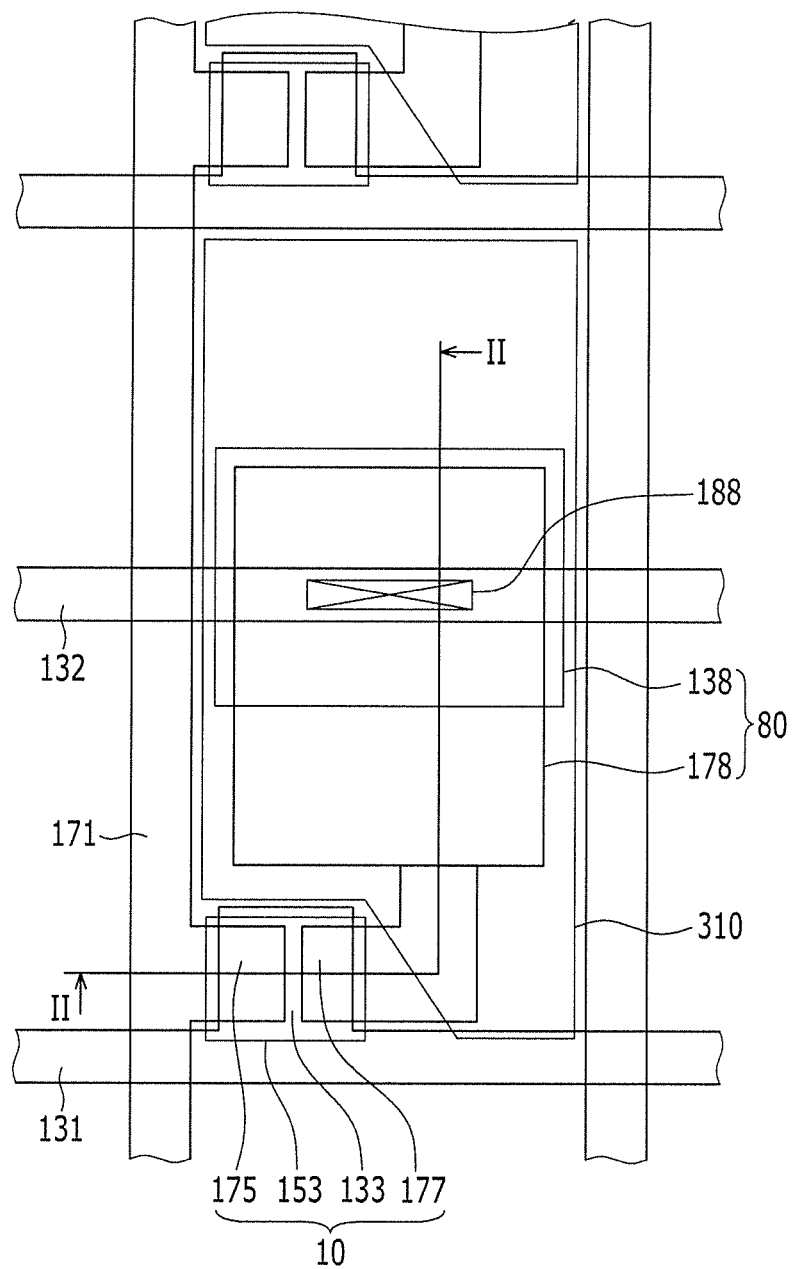
FIG. 1 is a layout view of a display device according to a first exemplary embodiment.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Like reference numerals designate like constituent elements throughout the specification. In exemplary embodiments other than a first exemplary embodiment among several exemplary embodiments, elements different from those of the first exemplary embodiment will be described in more detail.

Further, a size and thickness of each of the elements that are displayed in the drawings are described for better understanding and ease of description and the present invention is not limited by the described size and thickness.

In the drawings, the thickness of layers, films, panels, regions, etc., are exaggerated for clarity. In the drawings, for better understanding and ease of description, thicknesses of some layers and areas are excessively displayed. It will be understood that when an element (such as a layer, film, region, or substrate) is referred to as being "on" another element, it can be directly on the other element, or one or more intervening elements may also be present therebetween.

Figure 2:
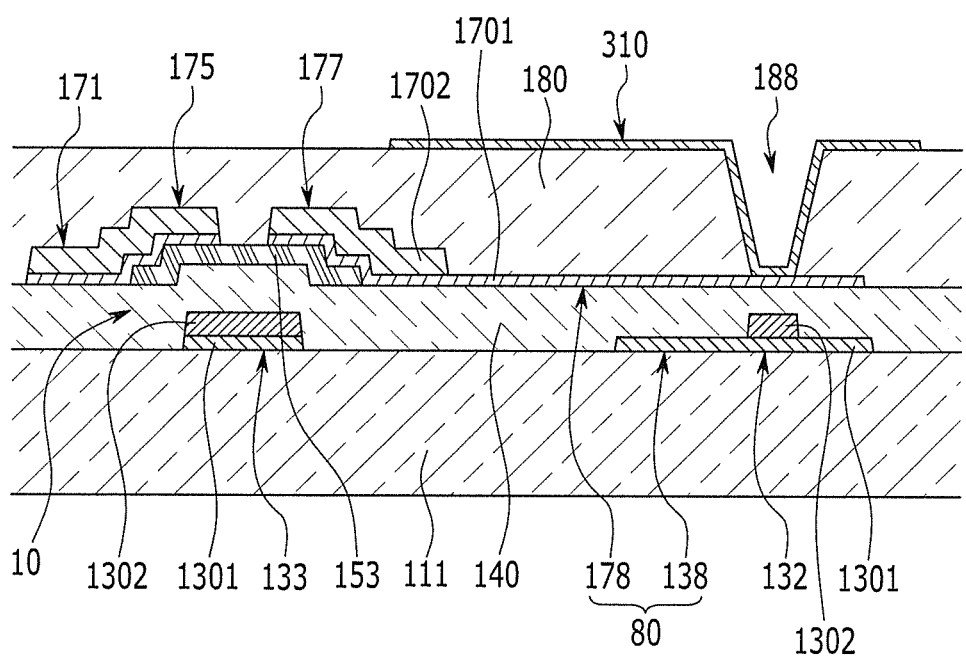
FIG. 2 is a cross-sectional view of FIG. 1, taken along the line II-II.

Hereinafter, a display device 101 according to the first exemplary embodiment will be described with reference to FIG. 1 and FIG. 2. FIG. 1 and FIG. 2 illustrate a liquid crystal display (LCD) as the display device 101, but the first exemplary embodiment is not limited thereto. Thus, an organic light emitting diode (OLED) display may be used as the display device 101 within a range that can be easily modified by a person skilled in the art.

A substrate 111 may be formed with various suitable insulating substrates made of glass, quartz, ceramic, and/or plastic. In addition, a buffer layer may be formed on the substrate 111. The buffer layer may have a single or multi-layered structure including at least one of insulating layers (such as a silicon oxide layer and/or a silicon nitride layer) using a chemical vapor deposition method and/or a physical vapor deposition method. The buffer layer blocks or prevents moisture or impurities generated from the substrate 111 from spreading and permeating through, and its surface can be planarized.

Gate wires 131, 132, 133, and 138 are formed on the substrate 111. The gate wires include a gate line 131, a capacitor line 132, a gate electrode 133, and a first capacitor electrode 138.

In addition, the gate wires 131, 132, 133, and 138 include a first transparent conductive layer and a second metal layer 1302 sequentially staked on the substrate 111. In further detail, in the first exemplary embodiment, the gate line 131, the capacitor line 132, and the gate electrode 133 are formed to have a multi-layered structure including the first transparent conductive layer 1301 and the first metal layer 1032 formed on the first transparent conductive layer 1301. Here, the first capacitor electrode 138 is formed by just the first transparent conductive layer 1301. That is, the first capacitor electrode 138 does not include the first metal layer 1302.

The first transparent conductive layer 1301 includes at least one of transparent conductive materials, such as indium tin oxide (ITO), indium zinc oxide (IZO), zinc indium tin oxide (ZITO), gallium indium tin oxide (GITO), indium oxide ($In_2O_3$), zinc oxide (ZnO), gallium zinc oxide (GZO), fluorine tin oxide (FTO), and/or aluminum-doped zinc oxide (AZO).

The first metal layer 1302 is formed including at least one of various suitable metal materials, such as molybdenum (Mo), chromium (Cr), aluminum (Al), silver (Ag), titanium (Ti), tantalum (Ta), and/or tungsten (W).

The gate electrode 133 is connected with the gate line 131, and the first capacitor electrode 138 is connected with the capacitor line 132. The gate line 131 and the capacitor line 132 are arranged in parallel with each other.

Since the gate electrode 133, the gate line 131, and the capacitor line 132 include the first metal layer 1302, they have an excellent electric characteristic. Particularly, the capacitor line 132 can effectively supply a voltage to the first capacitor electrode 138 formed by just the first conductive layer 1302.

In addition, since the capacitor line 132 includes the first metal layer 1302, it may function as a light blocking unit. That is, the capacitor line 132 covers an area having non-uniform electric field due to a stepped difference to thereby improve image quality of the display device 101.

The gate insulating layer 140 covers the gate wires 131, 132, 133, and 138. The gate insulating layer 140 is formed to include at least one of various suitable insulating materials, such as tetra ethyl orthosilicate (TEOS), silicon nitride ($SiN_x$), and/or silicon oxide ($SiO_2$).

The semiconductor layer 153 is formed on the gate insulating layer 140, and is disposed on a part of the gate wires 131, 132, 133, and 138. In further detail, the semiconductor layer 153 is at least partially overlapped with the gate electrode 133.

Also, in the first exemplary embodiment, an oxide semiconductor layer is used as the semiconductor layer 153. In further detail, the semiconductor layer 153 may include oxygen (O) and at least one of gallium (Ga), indium (In), zinc (Zn), hafnium (Hf), and tin (Sn). However, the first exemplary embodiment is not limited thereto. Thus, the semiconductor layer 153 may be formed with a silicon material.

Compared to a semiconductor layer formed with amorphous silicon, the oxide semiconductor layer has relatively high electron mobility and reliability, and compared to a semiconductor formed with polycrystalline silicon, the oxide semiconductor layer has merits in excellent uniformity and a simple manufacturing process.

The data wires 171, 175, 177, and 178 are formed on the gate insulating layer 140 and the semiconductor layer 153. The data wires include a data line 171, a source electrode 175, a drain electrode 177, and a second capacitor electrode 178.

The data wires 171, 175, 177, and 178 include a second transparent conductive layer 1701 and a second metal layer 1702 sequentially stacked on the gate insulating layer 140 and the semiconductor layer 153. In further detail, in the first exemplary embodiment, the data line 171, the source electrode 175, and the drain electrode 177 are formed to have a multi-layer structure including the second transparent conductive layer 1701 and the second metal layer 1702 formed on the second transparent conductive layer 1701. The second capacitor electrode 178 is formed by just the second transparent conductive layer 1701. That is, the second capacitor electrode 178 does not include the second metal layer 1702.

Like the first transparent conductive layer 1301, the second transparent conductive layer 1701 includes at least one of transparent conductive layers, such as ITO, IZO, ZITO, GITO, $In_2O_3$, ZnO, GZO, FTO, and/or AZO.

The second metal layer 1702, like the first metal layer 1302, is formed including at least one of various suitable metal materials, such as molybdenum (Mo), chromium (Cr), aluminum (Al), silver (Ag), titanium (Ti), tantalum (Ta), and/or tungsten (W).

The source electrode 175 is connected with the data line 171, and the source electrode 175 and the drain electrode 177 are separated from each other. In addition, the source electrode 175 and the drain electrode 177 respectively contact the semiconductor layer 153. That is, the source electrode 175 and the drain electrode 177 are at least partially formed on the semiconductor layer 153. In this case, the second transparent conductive layer 1701 of the source electrode 175 and the second transparent conductive layer 1701 of the drain electrode 177 respectively function as ohmic contact layers between the semiconductor layer 153 and the second metal layer 1702 of the source electrode 175, and between the semiconductor layer 153 and the second metal layer 1702 of the drain electrode 177. That is, the second transparent conductive layer 1701 of the source electrode 175 and the second transparent conductive layer 1701 of the drain electrode 177 reduce contact resistance between the semiconductor layer 153 and the second metal layer 1702 of the source electrode 175, and between the semiconductor layer 153 and the second metal layer 1702 of the drain electrode 177.

As described, according to the first exemplary embodiment, the second transparent conductive layer 1701 functioning as a resistive contact layer can be formed together when the data wires 171, 175, 177, and 178 are formed, and therefore an additional process for forming the ohmic contact layer can be omitted.

The second capacitor electrode 178 extends to the second transparent conductive layer 1701 of the drain electrode 177, and at least partially overlaps the first capacitor electrode 138.

The first capacitor electrode 138, the second capacitor electrode 178, and the gate insulating layer 140 between the first and second capacitor electrodes 138 and 178 become the capacitor 80. In this case, the gate insulating layer 140 becomes a dielectric material.

As described, the second capacitor electrode 178 extended from the drain electrode 177 and the first capacitor electrode 138 connected with the capacitor line 132 are formed by the transparent conductive layers 1301 and 1701, and therefore an aperture ratio of the display device 101 can be improved.

The data line 171 is formed in a direction crossing the gate line 131 and the capacitor line 132.

The interlayer insulating layer 180 covers the data wires 171, 175, 177, and 178, and has a pixel contact hole 188 partially exposing the second capacitor electrode 178. The pixel contact hole 188 is formed on the capacitor line 132.

In addition, in the first exemplary embodiment, the interlayer insulating layer 180 is formed with an organic material. For example, the interlayer insulating layer 180 may be a photosensitivity organic layer having an excellent planarization characteristic.

The pixel electrode 310 is disposed on the interlayer insulating layer 180. The pixel electrode 310 contacts the second capacitor electrode 178 through the pixel contact hole 188 of the interlayer insulating layer 180.

A liquid crystal layer is disposed on the pixel electrode 310, but the first exemplary embodiment is not limited thereto. That is, an organic emission layer may be disposed on the pixel electrode 310.

Meanwhile, a stepped portion is formed in the interlayer insulating layer 180 due to the pixel contact hole 188, and a non-uniform electric filed is formed in the stepped area so that the liquid crystal molecule arrangement of the liquid crystal layer disposed on the pixel electrode 310 may be twisted toward an undesired direction.

However, in the first exemplary embodiment, the pixel contact hole 188 is formed on the capacitor line 132, and therefore the capacitor line 132 including the first metal layer 1302 can protect from or prevent deterioration of image quality of the display device 101 by blocking light from the stepped portion where the electric field is not uniformly formed.

With such a configuration, the display device 101 according to the first exemplary embodiment can simplify its structure with improved aperture ratio.

In further detail, the source electrode 175 and the drain electrode 177 including the second transparent conductive layer 1701 that functions as the ohmic contact layer can be formed with the second capacitor electrode 178 through a photolithography process using one mask. That is, the source electrode 175, the drain electrode 177, and the second capacitor electrode 178 are formed in a simple structure. Accordingly, an additional process such as a process for doping impurities for forming the ohmic contact layer can be omitted.

Therefore, according to the first exemplary embodiment, the entire structure and manufacturing process can be simplified so that effectively high productivity of a large-sized display device 101 can be maintained.

In addition, both of the first capacitor electrode 138 and the second capacitor electrode 178 are formed with the transparent conductive layers 1301 and 701 so that the aperture ratio of the display device 101 can be significantly improved.

Hereinafter, a method for manufacturing the display device 101 according to the first exemplary embodiment will be described in more detail with references to FIG. 3 to FIG. 6.

Figure 3:
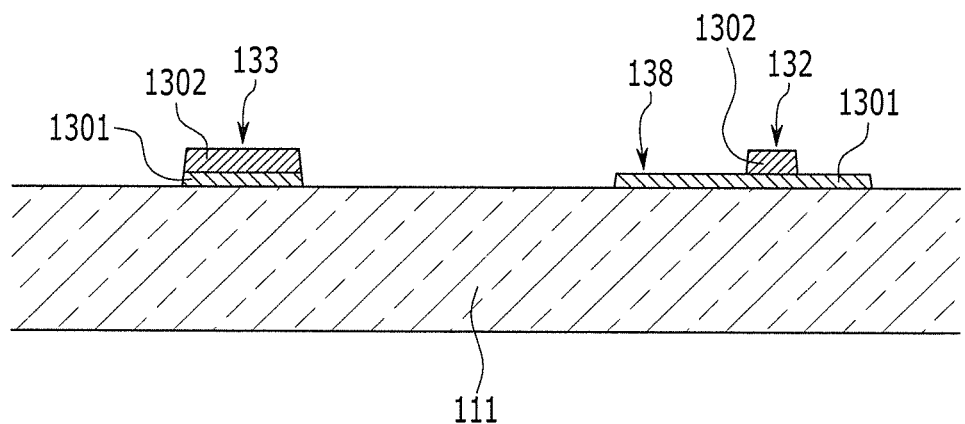
FIG. 3 to FIG. 6 are sequential cross-sectional views of a manufacturing method of the display device of FIG. 1 and FIG. 2.

First, as shown in FIG. 3, the substrate 111 made of glass, quartz, ceramic, plastic, or the like is prepared, and then the first transparent conductive 1301 and the first metal layer 1302 are sequentially stacked on the substrate 111. In addition, through a photolithography process using one mask, the gate line 131 (shown in FIG. 1), the gate wires including the capacitor line 132, the gate electrode 133, and the first capacitor electrode 138 are formed by patterning the first transparent conductive layer 1301 and the first metal layer 1302. In this case, the gate line 131, the capacitor line 132, and the gate electrode 133 are formed to have a multi-layer structure including the first transparent conductive layer 1301 and the first metal layer 1302, and the first capacitor electrode 138 is formed by just the first transparent conductive layer 1301.

The photolithography process for forming the gate wires 131, 132, 133, and 138 include a halftone exposure process and/or a double exposure process. Thus, the gate line 131, the capacitor line 132, the gate electrode 133, and the first capacitor electrode 138 can be formed together.

Figure 4:
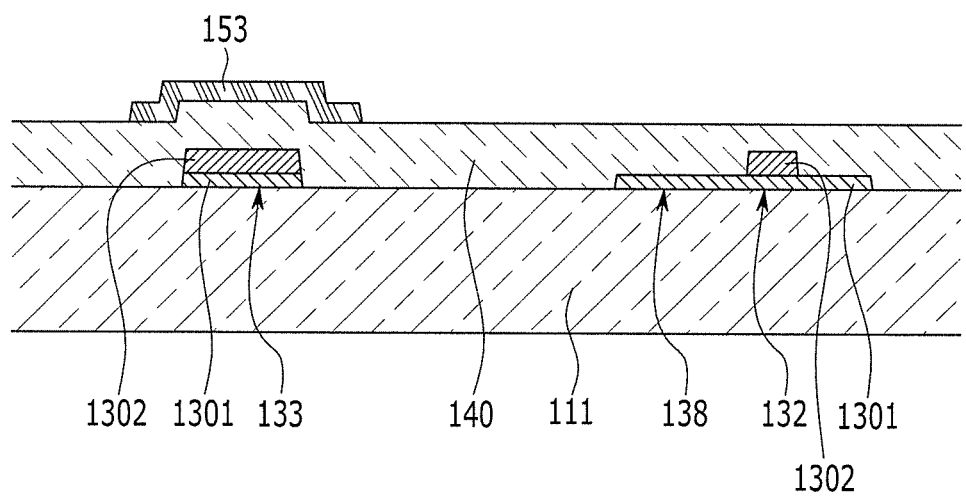

Next, as shown in FIG. 4, the gate insulating layer 140 covering the gate wires 131, 132, 133, and 138 is formed. In addition, the semiconductor layer 153 is formed on the gate insulating layer 140. The semiconductor layer 153 is at least partially overlapped with the gate electrode 133.

In addition, the semiconductor layer 153 includes oxygen (O) and at least one of gallium (Ga), indium (In), zinc (Zn), hafnium (Hf), and tin (Sn).

Figure 5:
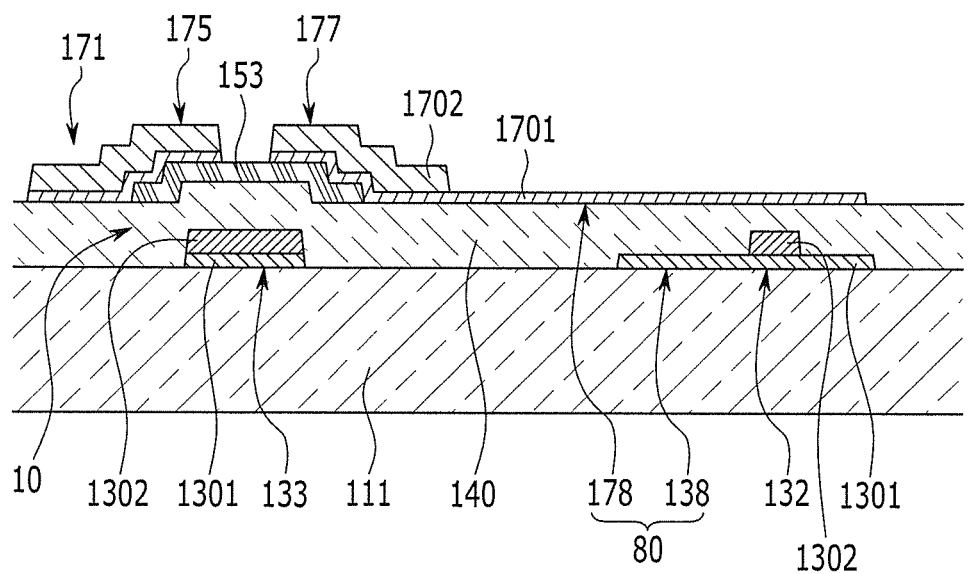

As shown in FIG. 5, the second transparent conductive layer 1701 and the second metal layer 1702 are sequentially stacked on the gate insulating layer 140 and the semiconductor layer 153. In addition, the data wires including the data line 171, the source electrode 175, the drain electrode 177, and the second capacitor electrode 187 are formed by patterning the sequentially stacked layers through the photolithography process using one mask. In this case, the data line 171, the source electrode 175, and the drain electrode 177 are formed to have a multi-layer structure including the second transparent conductive layer 1701 and the second metal layer 1702, and the second capacitor electrode 178 is formed by just the second transparent conductive layer 1701.

The photolithography process for forming the data wires 171, 175, 177, and 178 include a halftone exposure process or a double exposure process. Thus, the data line 171, the source electrode 175, the drain electrode 177, and the second capacitor electrode 178 can be formed together.

The source electrode 175 and the drain electrode 177 are respectively connected with the semiconductor layer 153, and the second capacitor electrode 178 extended from the second transparent conductive layer 1701 of the drain electrode 177 at least partially overlaps the first capacitor electrode 138.

In addition, the second transparent conductive layer 1701 of the source electrode 175 and the second transparent conductive layer 1701 of the drain electrode 177 respectively function as ohmic contact layers between the second metal layer 1702 of the source electrode and the semiconductor layer 153 and between the second metal layer 1702 of the drain electrode 177 and the semiconductor layer 153.

Figure 6:
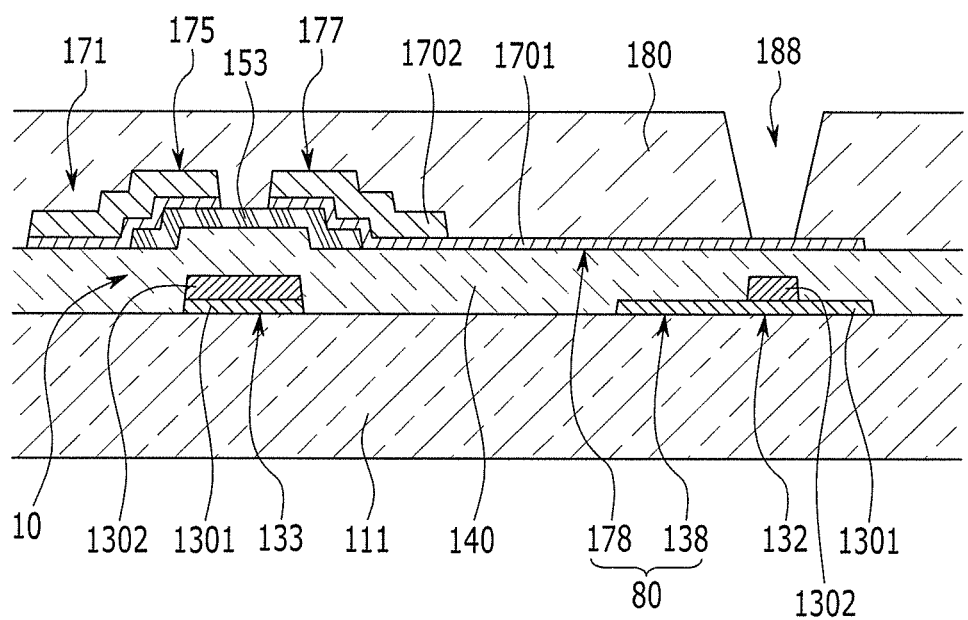

Next, as shown in FIG. 6, the interlayer insulating layer 180 covering the data wires 171, 175, 177, and 178 is formed. The interlayer insulating layer 180 is made of an organic material.

Further, the interlayer insulating layer 180 has the pixel contact hole 188 partially exposing the second capacitor electrode 178. The pixel contact hole 188 is disposed on the capacitor line 132.

The pixel electrode 310 is formed on the interlayer insulating layer 180. The pixel electrode 310 and the pixel contact hole 188 contact each other through the second capacitor electrode 178.

In addition, a liquid crystal layer may be disposed on the pixel electrode 310.

With such a manufacturing method, the display device 101 according to the first exemplary embodiment can be manufactured. That is, the number of masks used during the manufacturing process can be reduced or minimized by omitting an additional process for forming the ohmic contact layer.

Thus, according to the first exemplary embodiment, the large-sized display device 101 can effectively maintain high productivity.

In addition, since the first capacitor electrode 138 and the second capacitor electrode 178 are formed with the transparent conductive layers 1301 and 1701, the aperture ratio of the display device 101 can be significantly improved.

Hereinafter, a display device 102 according to a second exemplary embodiment will be described with reference to FIG. 7.

Figure 7:
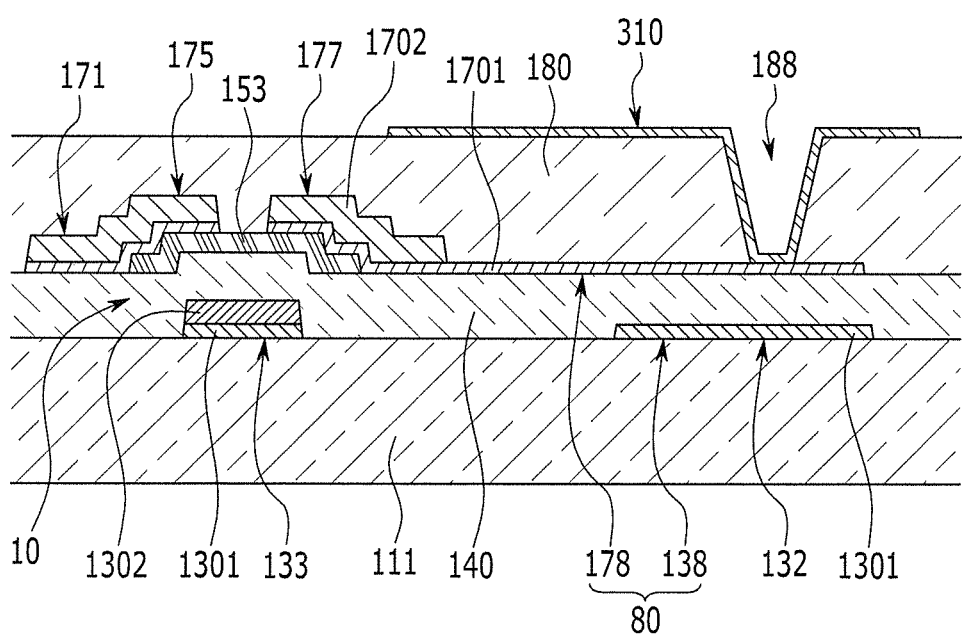
FIG. 7 is a cross-sectional view of a display device according to a second exemplary embodiment.

As shown in FIG. 7, a capacitor line 132 of the display device 102 according to the second exemplary embodiment is formed with a first transparent conductive layer 1301. That is, unlike the first exemplary embodiment, the capacitor line 132 does not include a first metal layer 1302.

With such a configuration, the display device 102 according to the second exemplary embodiment can have a further improved aperture ratio.

A manufacturing method of the display device 102 according to the second exemplary embodiment is substantially the same as that of the first exemplary embodiment, but excluding that the capacitor line 132 is formed with the first transparent conductive layer 1301.

Hereinafter, a display device 103 according to a third exemplary embodiment will be described with reference to FIG. 8.

Figure 8:
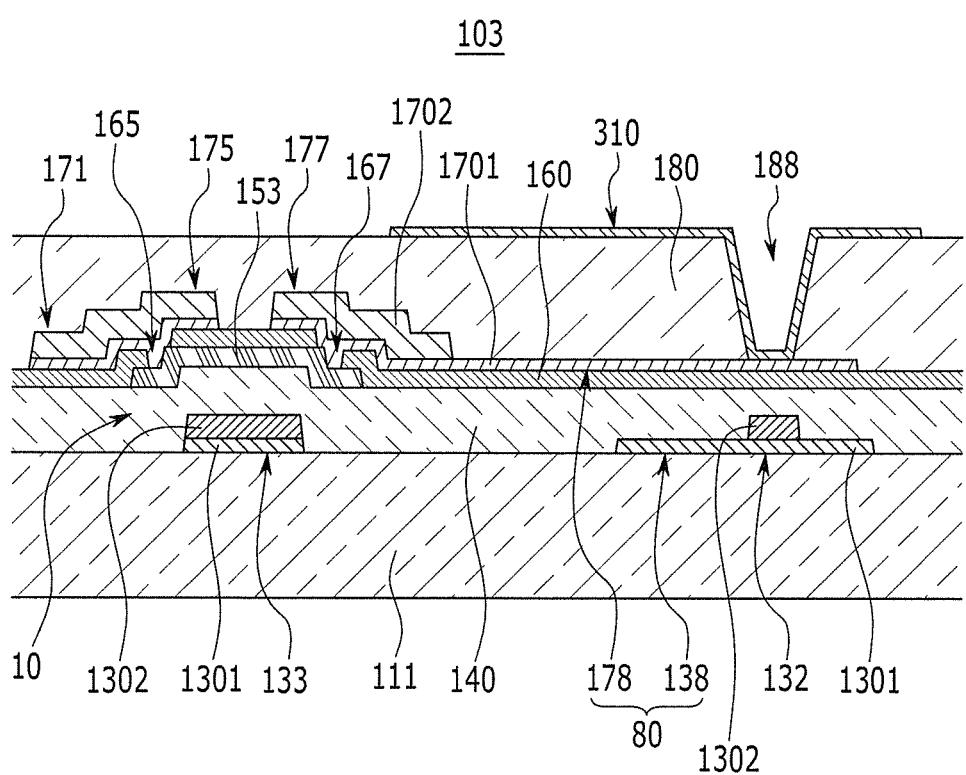
FIG. 8 is a cross-sectional view of a display device according to a third exemplary embodiment.

As shown in FIG. 8, the display device 103 according to the third exemplary embodiment further includes an etching prevention film 160 disposed between a semiconductor layer 153 and data wires 171, 175, 177, and 178.

The etching prevention film 160 protects or prevents the semiconductor 153 disposed under a source electrode 175 and a drain electrode 177 from being damaged during a process for forming the source electrode 175 and the drain electrode 177.

In addition, the etching prevention film 160 according to the third exemplary embodiment has a source contact hole 165 and a drain contact hole 167 respectively exposing a part of the semiconductor layer 153.

With such a configuration, the display device 103 according to the third exemplary embodiment can be further stably formed.

A manufacturing method of the display device 103 according to the third exemplary embodiment is substantially the same as that of the first exemplary embodiment, but further including a process for forming the etching prevention film 160. Here, a photolithography process is additionally performed in the manufacturing method of the third exemplary embodiment compared to the manufacturing method of the first exemplary embodiment.

Hereinafter, a display device 104 according to a fourth exemplary embodiment will be described with reference to FIG. 9.

Figure 9:
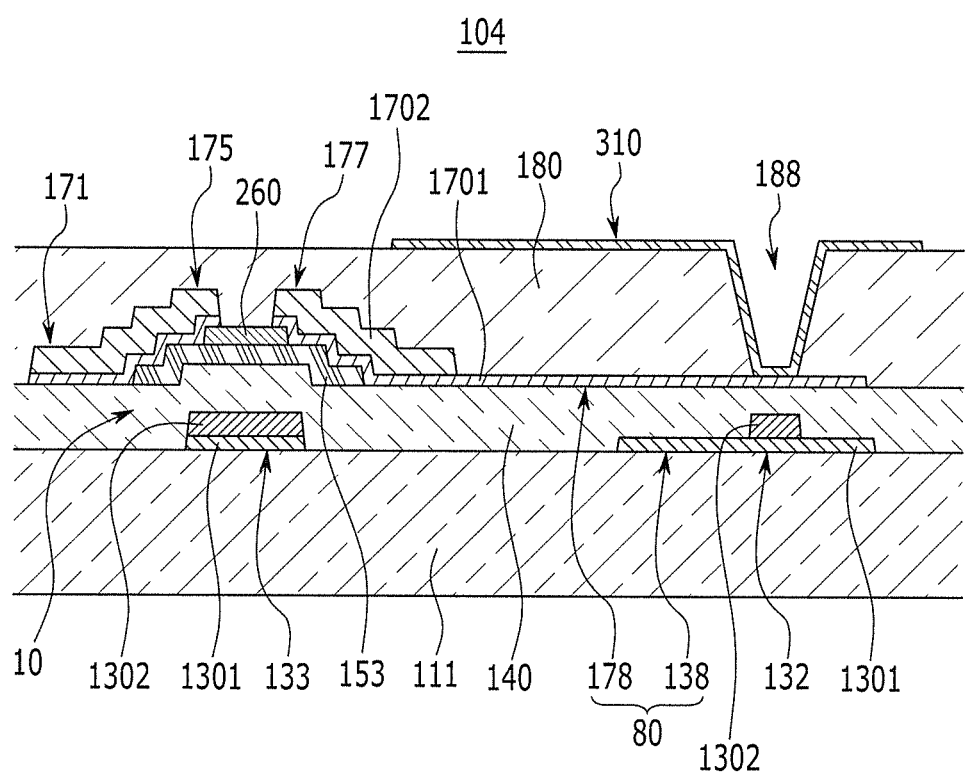
FIG. 9 is a cross-sectional view of a display device according to a fourth exemplary embodiment.

As shown in FIG. 9, the display device 104 according to the fourth exemplary embodiment further includes an etching prevention film 260 disposed between an area where a source electrode 175 and a drain electrode 177 are separated from each other and a semiconductor layer 153.

The etching prevention film 260 according to the fourth exemplary embodiment is restrictively formed on the semiconductor layer 153, unlike the etching prevention film 160 of the third exemplary embodiment.

With such a configuration, the display device 104 according to the fourth exemplary embodiment can be stably formed.

A manufacturing method of the display device 104 according to the fourth exemplary embodiment is substantially the same as that of the first exemplary embodiment, but further including a process for forming the etching prevention film 260. Here, a photolithography process is additionally performed in the manufacturing method of the fourth exemplary embodiment compared to the manufacturing method of the first exemplary embodiment.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

<Description of certain symbols>

| | |
|---|---|
| 10: thin film transistor | 80: capacitor |
| 101: display device | 111: substrate |
| 131: gate line | 132: capacitor line |
| 133: gate electrode | 138: first capacitor electrode |
| 140: gate insulating layer | 153: semiconductor layer |
| 160: etching prevention film | 171: data line |
| 175: source electrode | 177: drain electrode |
| 178: second capacitor electrode | 180: interlayer insulating layer |
| 310: pixel electrode | |

What is claimed is:

1. A display device comprising:
    a substrate;
    a plurality of gate wires, at least one of the gate wires having a first multi-layered structure comprising a first transparent conductive layer formed on the substrate and a first metal layer formed on the first transparent conductive layer and at least another one of the gate wires having a first single-layered structure formed with the first transparent conductive layer;
    a semiconductor layer formed on a part of the gate wires; and
    a plurality of data wires, at least one of the data wires having a second multi-layered structure comprising a second transparent conductive layer formed on the semiconductor layer and a second metal layer formed on the second transparent conductive layer and at least another one of the data wires having a second single-layered structure formed with the second transparent conductive layer.

2. The display device of claim 1, wherein the gate wires comprise a gate electrode, a first capacitor electrode, and a capacitor line, and wherein the semiconductor layer is at least partially formed on the gate electrode.

3. The display device of claim 2, wherein the gate electrode is formed to have the first multi-layer structure comprising the first transparent conductive layer and the first metal layer, and wherein the first capacitor electrode and the capacitor line are each formed with the first transparent conductive layer.

4. The display device of claim 2, wherein the gate electrode and the capacitor line are each formed to have the first multi-layer structure comprising the first transparent conductive layer and the first metal layer, and wherein the first capacitor electrode is formed with the first transparent conductive layer.

5. The display device of claim 2, wherein the data wires comprise a source electrode, a drain electrode, and a second capacitor electrode, wherein the source electrode and the drain electrode respectively contact the semiconductor layer, and wherein the second capacitor electrode at least partially overlaps the first capacitor electrode.

6. The display device of claim 5, wherein the source electrode and the drain electrode are each formed to have the second multi-layer structure comprising the second transparent conductive layer and the second metal layer, and wherein the second capacitor electrode is formed with the second transparent conductive layer.

7. The display device of claim 6, wherein the second capacitor electrode extends from the second transparent conductive layer of the drain electrode.

8. The display device of claim 6, wherein the source electrode and the drain electrode are each at least partially formed on the semiconductor layer, and wherein the second transparent conductive layer of the source electrode and the second transparent conductive layer of the drain electrode become ohmic contact layers between the semiconductor layer and the second metal layer of the source electrode, and between the semiconductor layer and the second metal layer of the drain electrode.

9. The display device of claim 6, further comprising an interlayer insulating layer covering the data wires,
wherein the interlayer insulating layer has a pixel contact hole partially exposing the second capacitor electrode.

10. The display device of claim 9, further comprising a pixel electrode formed on the interlayer insulating layer,
wherein the pixel electrode contacts the second capacitor electrode through the pixel contact hole.

11. The display device of claim 10, wherein the pixel contact hole is formed on the capacitor line.

12. The display device of claim 9, wherein the interlayer insulating layer comprises an organic material.

13. The display device of claim 6, wherein the semiconductor layer is an oxide semiconductor.

14. The display device of claim 13, wherein the semiconductor layer comprises oxygen (O) and at least one of gallium (Ga), indium (In), zinc (Zn), hafnium (Hf), and tin (Sn).

15. The display device of claim 6, further comprising an etching prevention film disposed between the semiconductor layer and the data wires,
wherein the etching prevention film has a source contact hole and a drain contact hole respectively exposing a part of the semiconductor layer, and
wherein the source electrode and the drain electrode respectively contact the semiconductor layer through the source contact hole and the drain contact hole.

16. The display device of claim 6, wherein the source electrode and the drain electrode are separated from each other on the semiconductor layer, and wherein the display device further comprises an etching prevention film disposed between the semiconductor layer and an area where the semiconductor layer, the source electrode, and the drain electrode are separated from each other.

17. A manufacturing method of a display device, the method comprising:
preparing a substrate;
sequentially stacking a first transparent conductive layer and a first metal layer on the substrate and then forming gate wires comprising a gate electrode, a first capacitor electrode, and a capacitor line by patterning the sequentially stacked first transparent conductive and first metal layers;
forming a gate insulating layer covering the gate wires;
forming a semiconductor layer at least partially overlapped with the gate electrode on the gate insulating layer; and
sequentially stacking a second transparent conductive layer and a second metal layer on the semiconductor layer and the gate insulating layer and then forming data wires comprising a source electrode contacting the semiconductor layer, a drain electrode contacting the semiconductor layer, and a second capacitor electrode at least partially overlapped with the first capacitor electrode by patterning the sequentially second transparent conductive and second metal stacked layers.

18. The manufacturing method of claim 17, wherein the gate electrode is formed to have a multi-layer structure comprising the first transparent conductive layer and the first metal layer, wherein the first capacitor electrode and the capacitor line are each formed with the first transparent conductive layer, and wherein the gate electrode, the first capacitor electrode, and the capacitor line are formed together through a photolithography process using one mask.

19. The manufacturing method of claim 17, wherein the gate electrode and the capacitor line are each formed to have a multi-layer structure comprising the first transparent conductive layer and the first metal layer, wherein the first capacitor electrode is formed with the first transparent conductive layer, and wherein the gate electrode, the capacitor line, and the first capacitor electrode are formed together through a photolithography process using one mask.

20. The manufacturing method of claim 17, wherein the source electrode and the drain electrode are each formed to have a multi-layer comprising the second transparent conductive layer and the second metal layer, wherein the second capacitor electrode is formed with the second transparent conductive layer, and wherein the source electrode, the drain electrode, and the second capacitor electrode are formed together through a photolithography process using one mask.

21. The manufacturing method of claim 20, wherein the second capacitor electrode extends from the second transparent conductive layer of the drain electrode.

22. The manufacturing method of claim 20, wherein the source electrode and the drain electrode are partially formed on the semiconductor layer, and wherein the second transparent conductive layer of the source electrode and the second transparent conductive layer of the drain electrode become ohmic contact layers between the semiconductor layer and the second metal layer of the source electrode, and between the semiconductor layer and the second metal layer of the drain electrode.

23. The manufacturing method of claim 20, further comprising:
forming an interlayer insulating layer covering the data wires,
wherein the interlayer insulating layer has a pixel contact hole partially exposing the second capacitor electrode.

24. The manufacturing method of claim 23, further comprising:
forming a pixel electrode on the interlayer insulating layer,
wherein the pixel electrode contacts the second capacitor electrode through the pixel contact hole.

25. The manufacturing method of claim 24, wherein the pixel contact hole is formed on the capacitor line.

26. The manufacturing method of claim 23, wherein the interlayer insulating layer comprises an organic material.

27. The manufacturing method of claim 20, wherein the semiconductor layer is an oxide semiconductor layer.

28. The manufacturing method of claim 27, wherein the semiconductor layer comprises oxygen (O) and at least one of gallium (Ga), indium (In), zinc (Zn), hafnium (Hf), and tin (Sn).

29. The manufacturing method of claim 20, further comprising:
   forming an etching prevention film between the semiconductor layer and the data wires,
   wherein the etching prevention film has a source contact hole and a drain contact hole respectively exposing the semiconductor layer, and
   wherein the source electrode and the drain electrode respectively contact the semiconductor layer through the source contact hole and the drain contact hole.

30. The manufacturing method of claim 20, wherein the source electrode and the drain electrode are separated from each other on the semiconductor layer, and wherein the manufacturing method further comprises forming an etching prevention film between the semiconductor layer and an area where the semiconductor layer, the source electrode, and the drain electrode are separated from each other.

* * * * *